(12) United States Patent
Danno

(10) Patent No.: US 10,260,167 B2
(45) Date of Patent: Apr. 16, 2019

(54) METHOD FOR PRODUCING SILICON CARBIDE SINGLE CRYSTAL IN A SOLUTION PROCESS USING A SEED CRYSTAL HAVING A BOTTOM FACE WITH A CIRCULAR SHAPE AND AT LEAST A PARTIALLY REMOVED SECTION

(71) Applicant: TOYOTA JIDOSHA KABUSHIKI KAISHA, Toyota-shi, Aichi-ken (JP)

(72) Inventor: Katsunori Danno, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/714,304

(22) Filed: Sep. 25, 2017

(65) Prior Publication Data
US 2018/0100247 A1 Apr. 12, 2018

(30) Foreign Application Priority Data
Oct. 7, 2016 (JP) .................. 2016-199126

(51) Int. Cl.
*C30B 9/04* (2006.01)
*C30B 29/36* (2006.01)
(Continued)

(52) U.S. Cl.
CPC .............. *C30B 29/36* (2013.01); *C30B 9/06* (2013.01); *C30B 19/04* (2013.01); *C30B 19/10* (2013.01); *C30B 29/403* (2013.01)

(58) Field of Classification Search
CPC .... C30B 9/00; C30B 9/04; C30B 9/06; C30B 9/08; C30B 9/10; C30B 15/00;
(Continued)

(56) References Cited

U.S. PATENT DOCUMENTS

| 2008/0014756 A1* | 1/2008 | Ishibashi | B24B 37/042 438/759 |
| 2014/0127466 A1* | 5/2014 | Danno | C30B 29/36 428/157 |

FOREIGN PATENT DOCUMENTS

| JP | 2008-98412 A | 4/2008 |
| JP | 2012-176867 A | 9/2012 |

(Continued)

OTHER PUBLICATIONS

Xiamen Powerway Advanced Material Co., Ltd., product catalog for "4H N type SiC" available at http://www.siliconcarbidewafer.com/4H-N-Type-SiC.html, accessed Oct. 11, 2018. (Year: 2018).*

Primary Examiner — Kenneth A Bratland, Jr.
(74) Attorney, Agent, or Firm — Oliff PLC

(57) ABSTRACT

A method for producing a SiC single crystal with few dislocations and defects and a large diameter enlargement ratio is provided. A method for producing a SiC single crystal by solution process, wherein a bottom face of a seed crystal is (0001) or (000-1) face and has circular shape with at least a partially removed section and a circular arc-shaped section on an outer periphery, the number of the removed sections is one or more, shapes of the removed sections are bow-shaped with a minor arc or semi-circumference removed along a chord connecting two points on the circular arc, a central angle formed by a center of the circular shape and the two points is 40° or greater, and a total of the central angles of the removed sections is no greater than 180°, the method comprising forming a meniscus and growing the single crystal from the bottom face.

5 Claims, 7 Drawing Sheets

(51) Int. Cl.
*C30B 9/06* (2006.01)
*C30B 19/04* (2006.01)
*C30B 19/10* (2006.01)
*C30B 29/40* (2006.01)

(58) Field of Classification Search
CPC ......... C30B 15/20; C30B 15/36; C30B 19/00; C30B 19/02; C30B 19/04; C30B 19/10; C30B 19/12; C30B 29/00; C30B 29/10; C30B 29/36; C30B 29/403; C30B 11/00; C30B 11/14
USPC ... 117/11, 13, 35–36, 54, 58, 60, 64–65, 67, 117/73, 78–79, 902, 937, 951
See application file for complete search history.

(56) References Cited

FOREIGN PATENT DOCUMENTS

| | | |
|---|---|---|
| JP | 2014-214032 A | 11/2014 |
| JP | 2014-231463 A | 12/2014 |
| WO | 2013/005347 A1 | 1/2013 |

\* cited by examiner

METHOD FOR PRODUCING SILICON CARBIDE SINGLE CRYSTAL IN A SOLUTION PROCESS USING A SEED CRYSTAL HAVING A BOTTOM FACE WITH A CIRCULAR SHAPE AND AT LEAST A PARTIALLY REMOVED SECTION

TECHNICAL FIELD

The present invention relates to a method for producing a SiC single crystal.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials, and the like.

Typical growth processes for growing SiC single crystals that are known in the prior art include gas phase processes, the Acheson process and solution processes. Among gas phase processes, such as sublimation processes, have a drawback in that grown single crystals have been prone to hollow penetrating defects known as micropipe defects, lattice defects, such as stacking faults, and generation of polymorphic crystals. However, most SiC bulk single crystals are conventionally produced by sublimation processes because of the high crystal growth rate. While attempts have been made to reduce defects in crystals grown by sublimation processes, it is difficult to grow defect-free crystals. In the Acheson process, heating is carried out in an electric furnace using silica stone and coke as starting materials, and therefore it has not been possible to obtain single crystals with high crystallinity due to impurities in the starting materials.

Solution processes are processes in which C is dissolved in molten Si or a molten liquid comprising an alloy melted in molten Si, in a graphite crucible, and a SiC crystal layer is deposited and grown on a seed crystal set in the low temperature zone. Solution processes can be expected to reduce defects because crystal growth is carried out in a state of near thermal equilibrium, compared to gas phase processes. In recent years, therefore, several methods for producing SiC single crystals by solution processes have been proposed, and in PTL 1 there has been proposed a method for obtaining SiC single crystals with few dislocations and crystal defects.

CITATION LIST

Patent Literature

[PTL 1] International Patent Publication No. WO2013/005347

SUMMARY OF THE INVENTION

Problems to be Solved by the Invention

PTL 1 attempts to enlarge the diameter and obtain a SiC single crystal with few dislocations and defects. However, the diameter enlargement ratio is still inadequate, and therefore a method is desired for further reducing dislocations and defects and obtaining a larger diameter enlarging section.

It is an object of the present invention to solve the above problem and to provide a method for producing a SiC single crystal with few dislocations and defects and a large diameter enlargement ratio.

Means for Solving the Problems

The embodiments of the present invention are as follows.

(1) A method for producing a SiC single crystal by a solution process in which a SiC seed crystal held on a seed crystal holding shaft is contacted with a Si—C solution having a temperature gradient such that a temperature of the Si—C solution decreases from an interior of the Si—C solution toward a surface of the Si—C solution, wherein the seed crystal has a bottom face situated parallel to the surface of the Si—C solution, a top face held on the seed crystal holding shaft, and a side face between the top face and the bottom face, the bottom face of the seed crystal is a (0001) face or (000-1) face, a shape of the bottom face of the seed crystal is a circular shape with at least a partially removed section, and having a circular arc-shaped section on an outer periphery of the bottom face, the number of the removed sections is one or more, shapes of the removed sections are bow-shaped with a minor arc or semi-circumference removed along a chord connecting two points on the circular arc, a central angle formed by a center of the circular shape and the two points on the circular arc of each removed section is 40° or greater, and a total of the central angles of the removed sections is no greater than 180°, the method comprising forming a meniscus between the seed crystal and the Si—C solution and growing the SiC single crystal from the bottom face of the seed crystal.

(2) A method according to (1) above, wherein the number of the removed sections is 1 to 4.

(3) A method according to (1) above, wherein the number of the removed sections is 1.

(4) A method according to any one of (1) to (3) above, comprising rotating the seed crystal in a direction parallel to the surface of the Si—C solution when the seed crystal is being contacted with the Si—C solution.

Effect of the Invention

According to the invention it is possible to obtain a SiC single crystal having few dislocations and defects and a large diameter enlarging section.

DESCRIPTION OF EMBODIMENTS

<Method for Producing SiC Single Crystal>

The method for producing a SiC single crystal according to an embodiment of the invention will now be described.

The method for producing a SiC single crystal according to an embodiment of the invention is a method for producing a SiC single crystal by a solution process in which a SiC seed crystal held on a seed crystal holding shaft is contacted with a Si—C solution having a temperature gradient such that the temperature decreases from the interior toward the surface, wherein the seed crystal has a bottom face situated parallel to the surface of the Si—C solution, a top face held on the seed crystal holding shaft, and a side face between the top face and the bottom face, the bottom face of the seed crystal is the (0001) face or (000-1) face, the shape of the bottom face of the seed crystal is a circular shape with at least a partially removed section, and having a circular arc-shaped section on the outer periphery, the number of the removed sections is one or more, the shapes of the removed sections are bow-shaped with a minor arc or semi-circumference removed along a chord connecting two points on the circular arc, the central angle formed by the center of the circular shape and the two points on the circular arc of each removed section is 40° or greater, and the total of the central angles of the removed sections is no greater than 180°, the method comprising forming a meniscus between the seed crystal and the Si—C solution and growing the SiC single crystal from the bottom face of the seed crystal.

The indication "−1" in an expression, such as "(000-1) face", is used where normally a horizontal line is placed over the numeral.

The "meniscus" is a concave curved surface formed on the bottom face of a seed crystal and the surface of a Si—C solution, by surface tension.

The term "circular shape" includes not only true circular shapes but also elliptical shapes.

The invention will now be explained with reference to the accompanying drawings.

Figure 2:
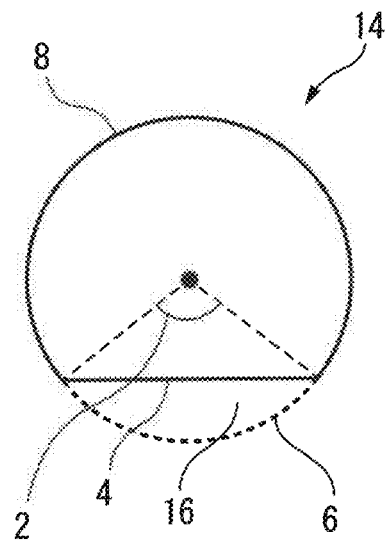
FIG. 2 is a diagram showing an example of the shape of the bottom face of a seed crystal, as an embodiment of the invention.

The removed section will be exemplified by a removed section 16 in FIG. 2. The removed section 16 is a section that has been removed from the circular-shaped seed crystal by cutting or polishing.

The minor arc is exemplified by a minor arc 6 in FIG. 2. The minor arc 6 is an arc that is smaller than a semi-circle obtained by dividing the circumference by two points on the circumference. The "semi-circumference" is one part of the circumference that has been separated into two parts by the diameter, and it corresponds to half of the circumference.

The bow shape is a shape exemplified by the removed section 16 in FIG. 2, being the shape resulting from the circular arc and the chord connecting both of its ends.

The central angle is exemplified by a central angle 2 in FIG. 2. The central angle 2 is the angle formed by the two radii passing through both ends of the circular arc.

The "circular arc-shaped section" is a section comprising a portion of a circular-shaped circumference.

The use of solution processes for crystal growth of SiC single crystals with the (0001) face or (000-1) face as the growth surface has been carried out in the prior art, and in such methods it is known that stacking faults and base plane dislocations are less likely to be propagated in grown crystals, while propagation of threading dislocations is more likely. For example, PTL 1 discloses growing a crystal using a common discoid seed crystal, and obtaining a single crystal containing no dislocations or defects in the regions lower than the bottom face (c-face) of the seed crystal and outward than directly below the c-face of the seed crystal.

However, when crystal growth is conducted using a discoid seed crystal which has been used in the prior art, a diameter enlarging section which is a high-quality SiC single crystal containing no dislocations is small, and there is an acknowledged need for a production method which can obtain a greater diameter enlargement ratio of a grown SiC single crystal.

The present inventors have conducted ardent research on methods for producing SiC single crystals with greater diameter enlargement ratios, and have obtained the new knowledge that the diameter enlargement ratio of a crystal grown from a removed section is greater than the diameter enlargement ratio of a crystal grown from the non-removed section (the arc-shaped section). In other words, it has been found that the diameter enlargement ratio of the crystal that grows from the removed section which is near to the center of the circle is larger than the diameter enlargement ratio of the crystal that grows from the arc-shaped section which is far from the center of the circle. As a result, it is possible to obtain a SiC single crystal having a larger portion with low dislocations.

The mechanism by which the diameter enlargement ratio of the crystal that grows from the removed section is larger than the diameter enlargement ratio of the crystal that grows from the non-removed section (the arc-shaped section), in the method for producing a SiC single crystal according to an embodiment of the invention, is conjectured to be as follows, although it is not our intention to be constrained to any particular theory.

If the central angle of one removed section after removal from a circular shape is 40° or larger, then the meniscus angle of the Si—C solution formed on the chord of the removed section will be larger than the meniscus angle of the Si—C solution formed at the arc-shaped section. If the meniscus angle is larger, the obtained crystal will have a larger diameter enlarging section because the obtained crystal will have a shape that basically conforms to the meniscus. Since the diameter enlarging section is a single crystal containing no dislocations and defects, a larger meniscus angle can form a large diameter enlarging section with few dislocations and defects. The meniscus angle referred to here is the angle represented by meniscus angles 30 and 31 shown in FIG. 3, being the angle formed between the meniscus 28 and a dashed line extended downward from the side face 36 of the seed crystal.

In addition, since the temperature distribution has circular symmetry in the in-plane direction of the Si—C solution, it is presumed that the single crystal attempts to grow in a circular shape due to the temperature distribution symmetry of the Si—C solution, even though the shape of the bottom face of the seed crystal is a non-circular shape having a removed section from at least part of a circular shape. If crystal growth is not promoted from the removed section, then the grown single crystal will not approach a circular shape. Therefore, crystal growth at the arc-shaped section acts to facilitate crystal growth at the removed section, presumably accelerating the diameter enlargement rate of the crystal grown from the removed section. As a result, the diameter enlargement ratio of the crystal that grows from the removed section (for example, the chord center point) is greater than the diameter enlargement ratio of the crystal that grows from the arc-shaped section. That is, the diameter enlargement ratio at the sections near the center of the circle (for example, the chord center point) is greater than the diameter enlargement ratio at the sections far from the center of the circle (for example, a point on the circumference of an arc-shaped section), which presumably allows a larger diameter enlarging section to be obtained compared to the prior art in which a circular-shaped seed crystal is used. The diameter enlargement ratio referred to here is represented by: Diameter enlargement ratio=length grown in diameter enlargement direction/length grown in direction perpendicular on bottom face of seed crystal.

Each of the features of the method for producing a Si—C single crystal according to an embodiment of the invention will now be described.

A solution process is used in the method for producing a SiC single crystal for an embodiment of the invention. A solution process for production of a SiC single crystal is a process in which a seed crystal is contacted with the surface of a Si—C solution having a temperature gradient such that the temperature decreases from the interior toward the surface, in a crucible, and a SiC single crystal is grown on the seed crystal by supersaturation of the Si—C solution near the seed crystal.

A Si—C solution, for an embodiment of the invention, is a solution in which C is dissolved in a solvent, the solvent being a molten liquid of Si or Si/X (X being one or more metals other than Si). X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe.

The Si—C solution for an embodiment of the invention is preferably a Si—C solution wherein the solvent is a molten liquid of Si/Cr/X (X being one or more metals other than Si and Cr). From the viewpoint of low variation in C dissolution, the Si—C solution is preferably one wherein the solvent is a molten liquid with an atomic composition percentage of Si/Cr/X=30-80/20-60/0-10. For example, Cr, Ni and the like may be loaded into the crucible in addition to Si, to form a Si—Cr solution, Si—Cr—Ni solution or the like.

The Si—C solution for an embodiment of the invention has a temperature gradient from the interior toward the surface. The temperature gradient in the surface region of the Si—C solution is a temperature gradient in the direction perpendicular to the surface of the Si—C solution, which is a temperature gradient where the temperature falls from the interior of the Si—C solution toward the surface of the solution. The surface temperature of the Si—C solution is preferably 1800° C. to 2200° C.

Temperature measurement of the Si—C solution can be carried out using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

The SiC seed crystal according to an embodiment of the invention is held by a seed crystal holding shaft. The seed crystal holding shaft may be a graphite shaft holding the seed crystal at one end face. The seed crystal holding shaft may have any desired shape, such as cylindrical or square columnar, and there may be used a graphite shaft having the same end face shape as the top face of the seed crystal.

Contact of the seed crystal with the Si—C solution may be conducted by lowering the seed crystal holding shaft holding the seed crystal toward the Si—C solution surface, and contacting the seed crystal with the Si—C solution while the bottom face of the seed crystal is parallel to the Si—C solution surface. The seed crystal may be held at a prescribed position relative to the Si—C solution surface for growth of the SiC single crystal. The bottom face of the seed crystal that is parallel to the Si—C solution surface may be essentially parallel to the Si—C solution surface.

The holding position of the seed crystal may be such that the position of the bottom face of the seed crystal is above the Si—C solution surface. In this case, the seed crystal is contacted once with the Si—C solution so that the Si—C solution is in contact with the bottom face of the seed crystal, and it is then raised to a prescribed position. The position of the seed crystal may be adjusted during crystal growth.

Figure 3:
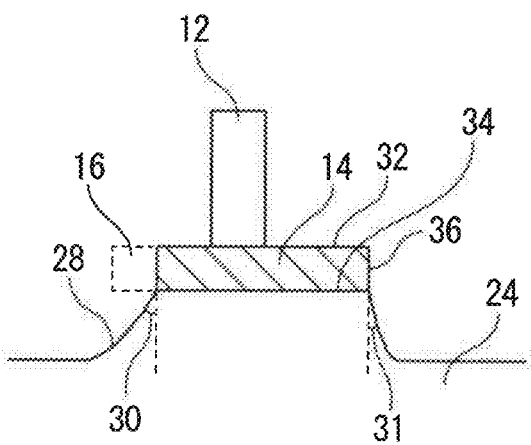
FIG. 3 is a cross-sectional schematic drawing showing meniscus formation using a seed crystal for an embodiment of the invention held on a seed crystal holding shaft.

In an embodiment of the invention, in order to carry out epitaxial growth from the (0001) face or (000-1) face which is the bottom face of the seed crystal, a meniscus is formed between the bottom face of the seed crystal and the Si—C solution, as shown in FIG. 3, and the SiC single crystal is formed. The "meniscus is formed" represents a state where the meniscus has been formed in the Si—C solution after contacting the bottom face of the seed crystal with the surface of the Si—C solution and raising the seed crystal to a prescribed position.

The seed crystal according to an embodiment of the invention has a bottom face situated parallel to the surface of the Si—C solution, a top face held by a seed crystal holding shaft, and a side face between the top face and the bottom face.

The seed crystal may be discoid, cylindrical or columnar, with an angle of 90° between the bottom face and side face of the seed crystal (hereunder referred to as "bottom face/side face angle"), or the seed crystal may be a truncated conic or truncated pyramidal shape with a bottom face/side face angle of smaller than 90°.

A discoid, cylindrical or columnar seed crystal having a bottom face/side face angle of 90° is relatively easily prepared. A truncated conic or truncated pyramidal seed crystal with a bottom face/side face angle of smaller than 90° can be prepared by cutting or polishing a discoid, cylindrical or columnar seed crystal.

The bottom face of the seed crystal of an embodiment of the invention is the (0001) face or (000-1) face. A single crystal is grown while forming a meniscus between the bottom face and the surface of the Si—C solution to increase the diameter. Crystal growth at the (0001) face or (000-1) face has more likely propagation of threading dislocations directly below the (0001) face or (000-1) face, and less likely propagation of stacking faults and base plane dislocations in the grown crystal. The diameter enlarging section is therefore a high-quality single crystal with no dislocations or defects.

The thickness of the seed crystal is not particularly restricted, but preferably it is no greater than 15 mm for practical use. A seed crystal with a thickness of 1 to 5 mm, for example, may be used.

The bottom face of the seed crystal for an embodiment of the invention may have the shape shown in FIG. 2, for example. As shown in FIG. 2, the seed crystal 14 has a removed section 16 from at least one part of the circular shape. The removed section 16 is a bow shape having a minor arc 6 or semi-circumference, removed along a chord 4 connecting two points on a circular arc. That is, the size of the removed section 16 is smaller than or approximately the same as the size of the seed crystal 14. The chord 4 may be essentially a straight line and the arc-shaped section 8 may be essentially a circular arc shape.

There may be one or more removed sections 16, formed in such a manner that the central angle 2 formed by the center of the circle and two points on the circular arc of any removed section 16 is 40° or larger, and the total of the central angles 2 of the removed sections 16 is no greater than 180°. If any one central angle 2 is 40° or larger and no larger than 180°, then when a meniscus 28 has been formed, as shown in FIG. 3, the meniscus angle 30 at the removed section 16 can be larger than the meniscus angle 31 at the arc-shaped section 8. If the meniscus angle 30 increases, then the enlargement of the diameter will be facilitated when the seed crystal is grown, thereby allowing a large diameter enlarging section with low dislocations and defects to be obtained. If the central angle 2 is smaller than 40°, then the meniscus angle 30 of the meniscus 28 that is formed will be essentially the same angle as the meniscus angle 31 of the arc-shaped section 8, and enlargement of the diameter will be impeded. If the central angle 2 of the removed section 16 is larger than 180°, then it will not be possible to achieve local increase in the meniscus angle at the removed section. In the production method according to an embodiment of the invention, the center of the circle preferably matches the center of the crucible. For this purpose, preferably the center of the crystal holding shaft is essentially matched with the center of the circle. This will be difficult if the central angle 2 is greater than 180°. Moreover, experimental results have shown that with an angle of greater than 165°, the effect of obtaining the larger meniscus angle begins to be reduced.

Figure 4:
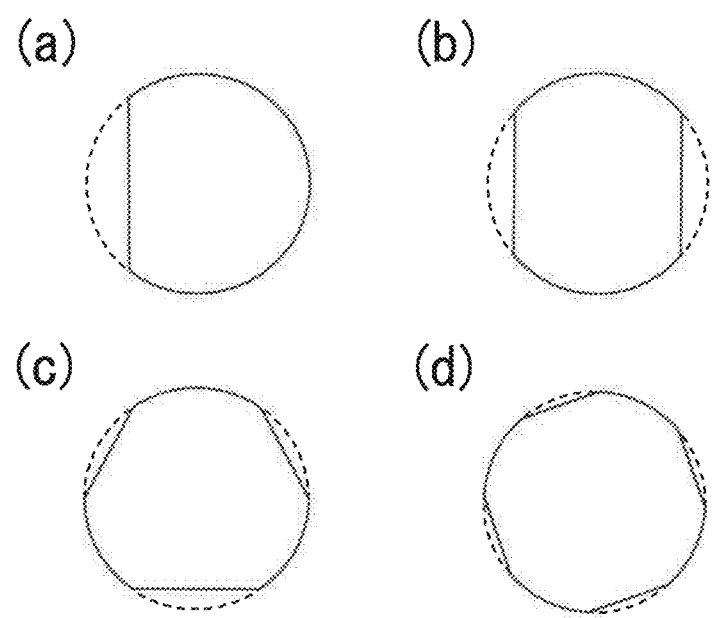
FIG. 4 (a)-(d) are diagrams showing examples of shapes for the bottom face of a seed crystal, as embodiments of the invention.

The shape of the bottom face of the seed crystal for an embodiment of the invention may be any of the shapes shown in FIG. 4, in addition to that of FIG. 2. The shapes of the bottom face of the seed crystal shown in FIG. 4 have removed sections from at least part of the circular shape, with arc-shaped sections on the outer periphery.

FIGS. 4(*a*), (*b*), (*c*) and (*d*) show examples of an embodiment of the invention, with no particular limitation to these, and the central angles formed by the removed sections are 100°, 90°, 60° and 45°, respectively, and thus all are 40° or larger. Therefore, the meniscus angle is larger than the meniscus angle formed when using a conventional circular-shaped seed crystal, and diameter enlargement is easier than when using a circular-shaped seed crystal. For each shape, the totals of the central angles of all of the removed sections are 100°, 180°, 180° and 180°, respectively, and thus all are 180° or smaller.

From the viewpoint of increasing the diameter enlarging sections, the total of the central angles of the removed sections is preferably 40° to 180°, more preferably 40° to 110° and even more preferably 40° to 90°.

The number of the removed sections in the shape of the bottom face of the seed crystal, according to an embodiment of the invention, is not particularly restricted so long as the central angle formed by the center of the circle and two points on the circular arc of one removed section is 40° or larger, and the total of the central angles of the removed sections is no greater than 180°, but it is preferably 1 to 4, more preferably 1 to 3, even more preferably 1 to 2 and most preferably 1. A lower number of the removed sections allows the size of each removed section to be increased, and thus allows the diameter enlarging section to be increased.

Since a seed crystal used to grow a SiC single crystal will sometimes already have dislocations or defects, if those dislocations or defects are near the circular-shaped perimeter, the sections that include the dislocations or defects can be cut out. That is, by forming the removed sections which can obtain a large diameter enlargement ratio while cutting out the dislocations or defects, it is possible to efficiently produce a high-quality SiC single crystal.

The method of forming the removed sections may be any desired one, such as cutting out or polishing.

When a seed crystal is contacted with a Si—C solution for an embodiment of the invention, the seed crystal may be rotated in a direction parallel to the surface of the Si—C solution. By rotating the seed crystal it is possible to further minimize generation of dislocations or defects due to variation in the heat distribution of the Si—C solution. In addition, the single crystal that is to be formed can be easily grown into a symmetrical circular shape. The rotational speed is preferably about 1 to 5 rpm.

Figure 1:
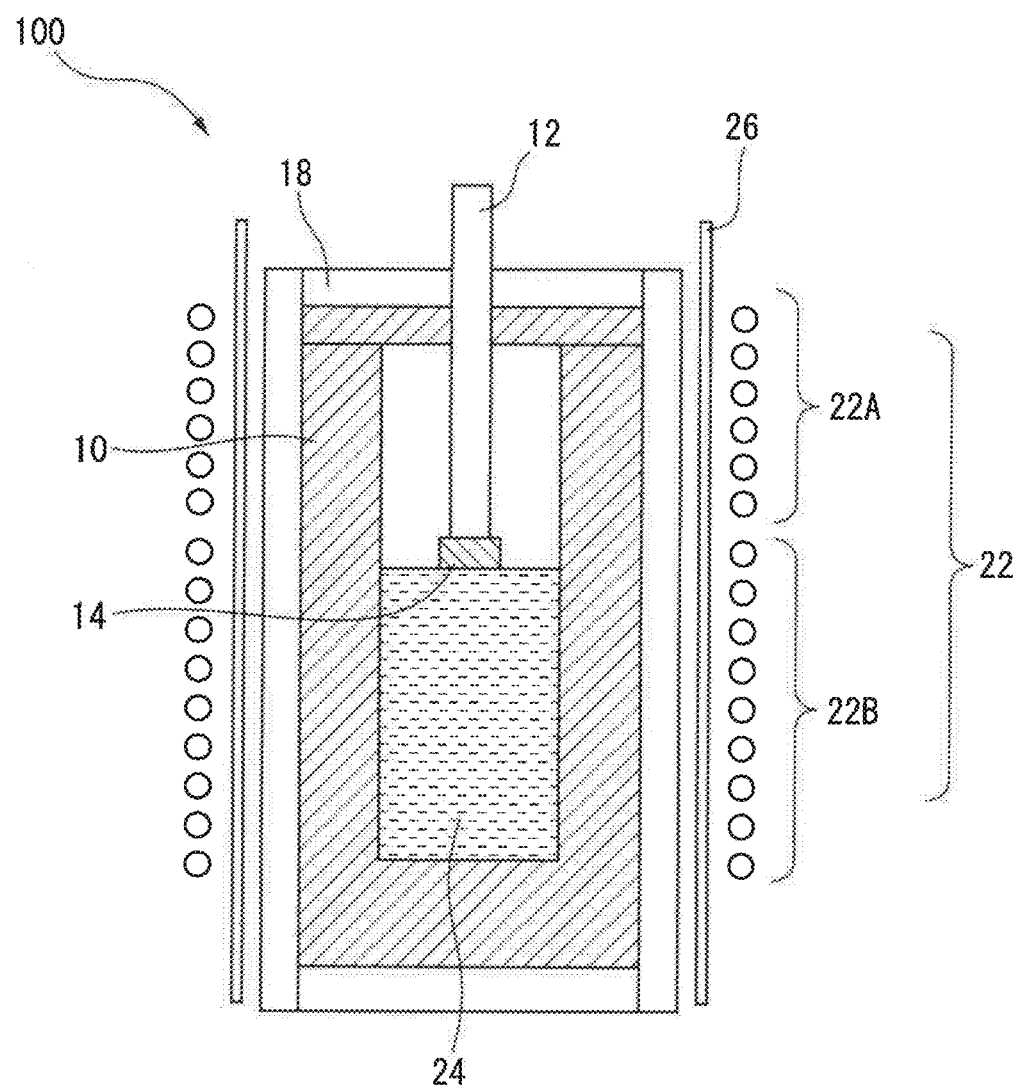
FIG. 1 is a cross-sectional schematic drawing of a SiC single crystal production apparatus based on a solution process, to be used for the invention.

FIG. 1 shows an example of a SiC single crystal production apparatus suitable for carrying out the method of the invention. The illustrated SiC single crystal production apparatus 100 comprises a crucible 10 that receives a Si—C solution 24 having C dissolved in a molten liquid of Si or Si/X, wherein a temperature gradient is formed in which the temperature is decreased from the interior of the Si—C solution toward the surface of the solution, and the seed crystal 14 which is held at the tip of the vertically movable graphite shaft 12 is contacted with the Si—C solution 24 to allow growth of the SiC single crystal. The crucible 10 and/or graphite shaft 12 may be rotated.

The Si—C solution 24 is prepared by loading the starting materials into the crucible, melting them by heating to prepare a Si or Si/X molten liquid, and dissolving C therein. If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are accommodated together inside a quartz tube 26. A high-frequency coil 22 for heating is disposed around the outer periphery of the quartz tube 26. The high-frequency coil 22 may be configured with an upper level coil 22A and a lower level coil 22B, the upper level coil 22A and lower level coil 22B can be independently regulated.

Since the temperatures of the crucible 10, heat-insulating material 18, quartz tube 26 and high-frequency coil 22 are high, they are placed inside a water-cooling chamber. The water-cooling chamber is provided with a gas inlet and a gas exhaust vent for Ar, He, $N_2$ or the like.

The temperature of the Si—C solution will usually have a temperature distribution in which the temperature of the surface of the Si—C solution is lower than the interior due to radiation and the like. However, by adjusting the number of coils and spacing of the high-frequency coil 22, the positional relationship of the high-frequency coil 22 and the crucible 10 in the height direction, and the output of the high-frequency coil, it is possible to create a prescribed temperature gradient in the Si—C solution 24 in the direction perpendicular to the surface of the Si—C solution 24 so that the upper portion of the solution in which the seed crystal 14 is immersed is at low temperature and the lower portion of the solution is at high temperature. For example, the output of the upper level coil 22A may be smaller than the output of the lower level coil 22B, to form a prescribed temperature gradient in the Si—C solution 24 in which the upper portion of the solution is at low temperature while the lower portion of the solution is at high temperature. The temperature gradient may be about 1 to 30°/cm, in a range to about a 10 mm depth from the solution surface, for example.

The C that has dissolved in the Si—C solution 24 is dispersed by diffusion and convection. In the region near the bottom face of the seed crystal 14, a temperature gradient is formed so that it is at a lower temperature than the lower portion of the Si—C solution 24, by output control of the upper level/lower level of the coil 22, heat radiation from the surface of the Si—C solution, and heat loss through the graphite shaft 12. When the C that has dissolved into the lower portion of the solution that is at high temperature and has high solubility reaches the region near the bottom face of the seed crystal that is at low temperature and has low solubility, a supersaturated state appears and a SiC single crystal is grown on the seed crystal 14 by virtue of supersaturation as a driving force.

In some embodiments, meltback may be carried out in which the surface layer of the SiC seed crystal is dissolved in the Si—C solution and removed prior to growth of a SiC single crystal. Since the surface layer of the seed crystal on which the SiC single crystal is to be grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of the SiC seed crystal, it is preferably about 5 to 50 μm for sufficient removal of an affected layer and a natural oxide film.

The meltback may be carried out by forming in the Si—C solution a temperature gradient such that the temperature increases from the interior of the Si—C solution toward the surface of the solution, i.e. by forming a temperature gradient in a direction opposite to the case of the SiC single crystal growth. The temperature gradient in the opposite direction can be formed by controlling the output of the high-frequency coil.

The meltback can be carried out by simply immersing the seed crystal in the Si—C solution that has been heated to a higher temperature than the liquidus temperature without forming a temperature gradient in the Si—C solution. In this case, the dissolution rate increases with higher Si—C solution temperature, but control of the amount of dissolution is difficult and a low temperature may slow the dissolution rate.

When the bottom face of the seed crystal is contacted with the Si—C solution surface, the bottom face of the seed crystal has an offset angle of 0±10°, preferably 0±5°, more preferably 0±2° and even more preferably 0±1° from the (0001) face or (000-1) face, and most preferably it is parallel to the (0001) face or (000-1) face. Since threading dislocation that may propagate from the seed crystal to the grown crystal may be generated in the direction perpendicular to the (0001) face or (000-1) face, the more closely parallel the bottom face of the seed crystal is to the (0001) face or (000-1) face, the less likely threading dislocation will be to occur in the diameter enlarging section.

In some embodiments, the seed crystal may be preheated in advance, and then the same is contacted with the Si—C solution. If the seed crystal at low temperature is contacted with the Si—C solution at high temperature, heat shock dislocation may be generated in the seed crystal. Preheating of the seed crystal before contacting the seed crystal with the Si—C solution prevents heat shock dislocation and is effective for growth of a high-quality SiC single crystal. The seed crystal may be heated together with the graphite shaft. In this case, heating of the seed crystal holding shaft is stopped after contact of the seed crystal with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

EXAMPLES

<Fabrication of Seed Crystal>

Comparative Example 1

A discoid 4H—SiC seed crystal with a bottom face circular diameter of 41 mm was bonded to approximately the center section of the end face of a cylindrical graphite shaft, using a graphite adhesive. The bottom face (growth surface) of the seed crystal was the (000-1) face.

A SiC single crystal production apparatus as shown in FIG. 1 was used, and Si/Cr/Ni was loaded in as a molten liquid material at an atomic composition percentage of 50:40:10, in a graphite crucible 10 for housing a Si—C solution 24. The air in the single crystal production apparatus was exchanged with helium. A high-frequency coil 22 situated around the periphery of the graphite crucible 10 was electrified to melt the starting material in the graphite crucible 10 by heating, thereby forming a Si/Cr/Ni alloy molten liquid. Then, a sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10 so that a temperature gradient in which the temperature decreased from the interior of the Si—C solution 24 toward the surface of the solution was formed. Formation of the prescribed temperature gradient was confirmed using a thermocouple comprising a vertically movable zirconia-coated tungsten-rhenium wire placed in a graphite protection tube, to measure the temperature of the Si—C solution 24. Output of the high-frequency coils 22A and 22B was controlled to adjust the temperature to 2000° C. on the surface of the Si—C solution 24. With the surface of the Si—C solution as the low-temperature side, the temperature difference between the temperature at the surface of the Si—C solution and the temperature at a depth of 10 mm in the vertical direction from the surface of the Si—C solution 24 toward the interior of the solution was 10° C.

The seed crystal was contacted with the Si—C solution while keeping the bottom face of the seed crystal bonded to the graphite shaft parallel to the Si—C solution surface, the position of the bottom face of the seed crystal was situated to match the liquid level of the Si—C solution and raised 0.3 mm from the liquid level of the Si—C solution to form a meniscus, and a crystal was grown for 15 hours.

Figure 5:
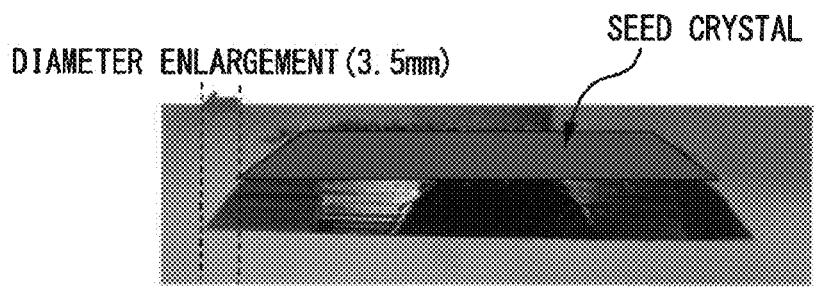
FIG. 5 is a photograph taken from the side face of a crystal obtained by the crystal growth in Comparative Example 1.

Upon completion of the crystal growth, the graphite shaft was raised and the seed crystal and the SiC crystal grown from the seed crystal were severed from the Si—C solution and the graphite shaft and were recovered. The obtained grown crystal was a single crystal, and a growth rate was 250 μm/h. FIG. 5 shows a photograph of the grown single crystal observed from the side face. As shown in FIG. 5, the diameter of the obtained grown crystal increased 7 mm (3.5 mm each side) beyond the diameter of the seed crystal. The crystal also grew 4 mm in the direction perpendicular to the bottom face of the seed crystal. The diameter enlargement ratio was approximately equal in all directions and was 0.875, and thus the diameter was enlarged in an essentially symmetrical manner.

Example 1

Figure 6:
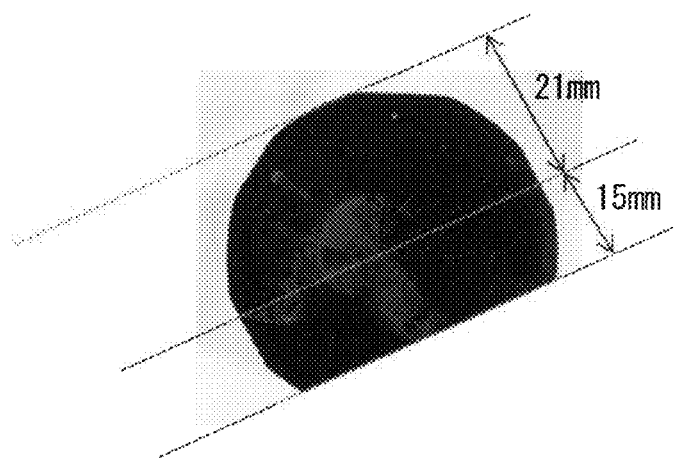
FIG. 6 is a diagram showing the shape of the bottom face of a seed crystal before crystal growth in Example 1.

A removed section was formed in a SiC seed crystal similar to the one in Comparative Example 1, as shown in FIG. 6, the distance from the center point on the circular arc to the center point on the chord (the length of the removed section) of the removed section being 6 mm. The central angle was 88°, and the distance from the center of the seed crystal to the chord after creation of the removed section was 15 mm. A crystal was grown under the same conditions as Comparative Example 1.

Figure 7:
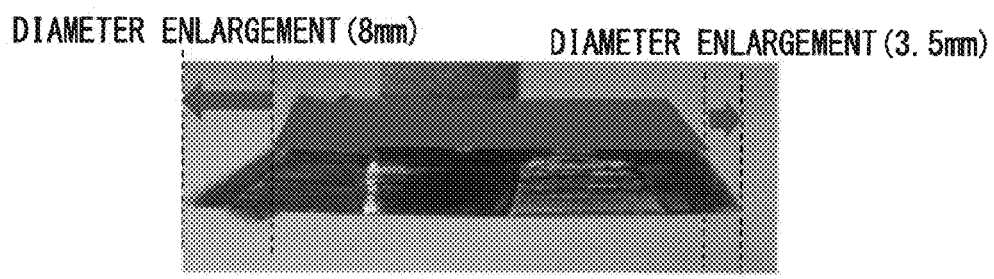
FIG. 7 is a photograph of a grown crystal obtained in Example 1 taken from the side face.
Figure 8:
FIG. 8 is a photograph of a grown crystal obtained in Example 1 taken from the top face of a seed crystal.
Figure 12:
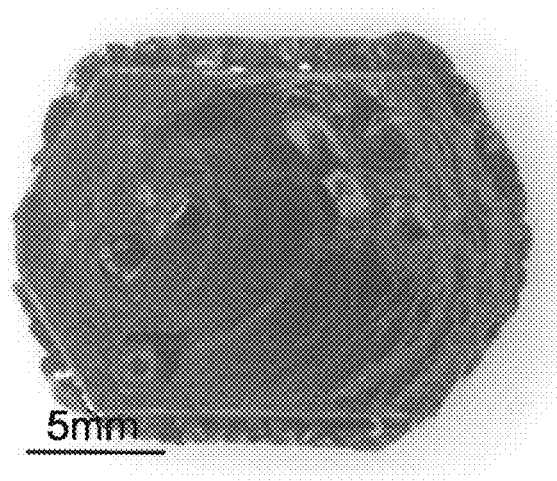
FIG. 12 is a photograph of a grown crystal obtained in Example 1 taken from the growth surface.

FIGS. 7, 8 and 12 show photographs taken of the grown crystal obtained in Example 1. FIG. 7 is a photograph of the grown crystal taken from the side face. FIG. 8 is a photograph of the grown crystal taken from the top face of the seed crystal. FIG. 12 is a photograph of the grown crystal taken from the growth surface. As shown in FIGS. 7 and 8, the diameter was enlarged 3.5 mm at the arc-shaped section, similar to Comparative Example 1. In contrast, at the removed section, the diameter was enlarged 8 mm, which was 4.5 mm more than crystal growth at the arc-shaped sections. The crystal also grew 4 mm in the direction perpendicular to the bottom face of the seed crystal. The diameter enlargement ratio at the removed section was 2, while the diameter enlargement ratio at the arc-shaped section was 0.875. In other words, the diameter enlargement ratio at the chord of the removed section was greater than the diameter enlargement ratio at portions other than the removed section.

Comparative Example 2

A removed section with a removed section length of 1 mm and a central angle of 35° was formed in a discoid 4H—SiC seed crystal with a bottom face circular diameter of 43 mm, and the seed crystal was then bonded to approximately the center section of the end face of a cylindrical graphite shaft, using a graphite adhesive. The bottom face (growth surface) of the seed crystal was the (000-1) face. The relationship between the shape of the removed section and the meniscus angle was examined. The meniscus was formed by the same method as in Comparative Example 1.

Example 2

The meniscus angle was measured by the same method as Comparative Example 2, except that the removed section length was 1.5 mm and the central angle was 40°.

Example 3

The meniscus angle was measured by the same method as Comparative Example 2, except that the removed section length was 6 mm and the central angle was 88°.

Example 4

The meniscus angle was measured by the same method as Comparative Example 2, except that the removed section length was 9 mm and the central angle was 109°.

Example 5

The meniscus angle was measured by the same method as Comparative Example 2, except that the removed section length was 16 mm and the central angle was 88°.

Table 1 below shows the measurement results for the meniscus angles of Examples 1 to 5 and Comparative Examples 1 and 2.

TABLE 1

| | Diameter of seed crystal bottom face [mm] | Presence of removed section | Removed section length [mm] | Central angle [°] | Meniscus angle [°] |
|---|---|---|---|---|---|
| Comp. Ex. 1 | 41 | Absent | 0 | — | 13 |
| Example 1 | | Present | 6 | 88 | 34 |
| Comp. Ex. 2 | 43 | | 1 | 35 | 13 |
| Example 2 | | | 1.5 | 40 | 26 |
| Example 3 | | | 6 | 88 | 34 |
| Example 4 | | | 9 | 109 | 38 |
| Example 5 | | | 16 | 88 | 165 |

Evaluation

A crystal with an 8 mm diameter enlarged section was cut out from the SiC single crystal obtained in Example 1, and the cut crystal was used as a seed crystal for epitaxial growth. The offset angle was 4°. No threading dislocations were present in the cut seed crystal.

Figure 9:
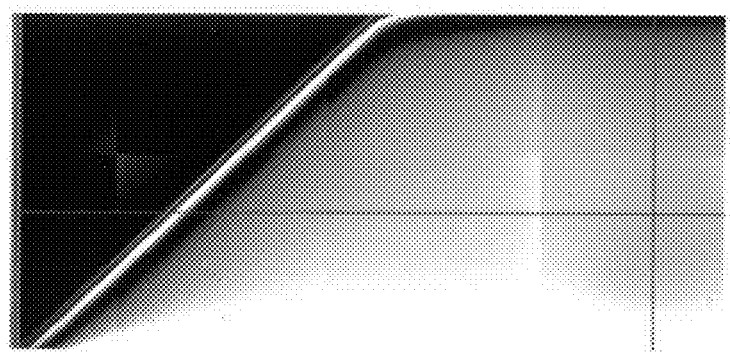
FIG. 9 is a photograph (PL imaging) showing the surface of a single crystal epitaxially grown on a diameter enlarging section of a grown crystal obtained in Example 1.

FIG. 9 shows the results observed on the surface of the epilayer formed by epitaxial growth. As shown in FIG. 9, it can be seen that the surface of the formed epilayer was smooth, and that a clean epilayer had been formed.

The numbers of defects in the grown epilayer and the epilayer of a commercially available substrate were observed. The surface irregularities were detected with a confocal microscope, and the numbers of hole defects (pits) and triangular defects (triangle defects) were counted. The results are shown in Table 2. As shown in Table 2, the epilayer that formed over the crystal of the diameter enlarging section that was grown using the seed crystal of Example 1 was confirmed to have numbers of pits and triangle defects that were lower than the commercially available crystal. In other words, the epilayer formed over the crystal of the diameter enlarging section that was grown using the seed crystal of Example 1 was confirmed to be of high quality.

TABLE 2

|  | Pits (num/cm$^2$) | Triangle defects (num/cm$^2$) |
|---|---|---|
| Example 1 | 160 | <2 |
| Commercial crystal | 400 | 100 |

A Schottky diode (SBD) was fabricated using the epilayer formed over the crystal of the diameter enlarging section that was grown using the seed crystal of Example 1, and Ni as a Schottky electrode, and the forward direction I-V characteristic and reverse direction I-V characteristic were measured. The results are shown in FIGS. 10 and 11.

Figure 10:
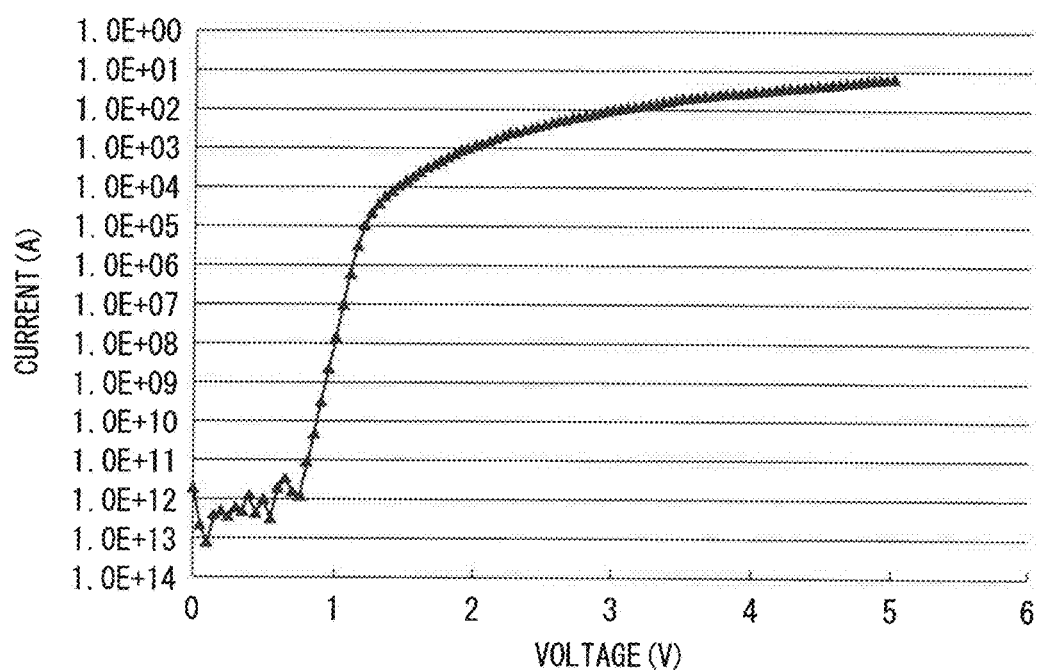
FIG. 10 is a graph showing the current-voltage characteristic (forward direction) of a Schottky diode fabricated by using a single crystal epitaxially grown on a diameter enlarging section of a grown crystal obtained in Example 1.

FIG. 10 shows the forward direction I-V characteristic, with voltage on the abscissa and current on the ordinate. As shown in FIG. 10, current flowed during application of the prescribed voltage (for example, 2.0 V). That is, it was demonstrated that the epilayer formed on the crystal at the section that was grown using the seed crystal of Example 1 functioned normally as a diode.

Figure 11:
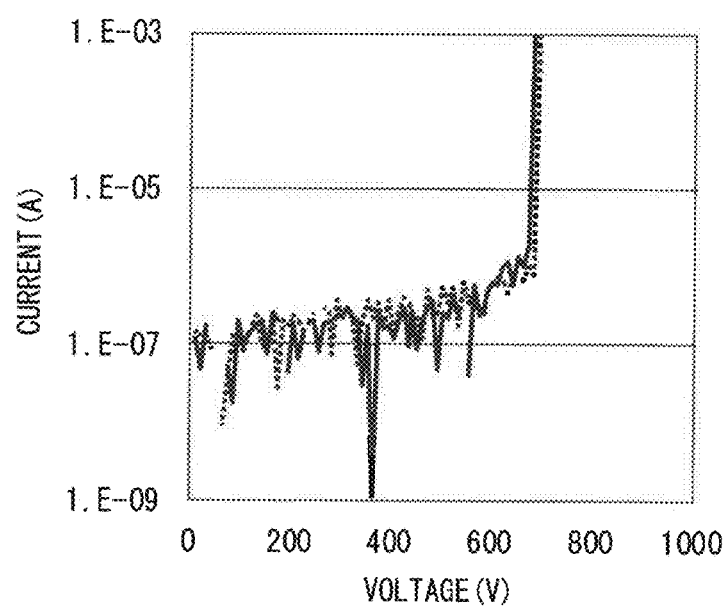
FIG. 11 is a graph showing the current-voltage characteristic (reverse direction) of a Schottky diode fabricated by using a single crystal epitaxially grown on a diameter enlarging section of a grown crystal obtained in Example 1.

FIG. 11 shows the reverse direction I-V characteristic, with voltage on the abscissa and current on the ordinate. In FIG. 11, increasing voltage corresponds to increased voltage in the opposite direction. FIG. 11 shows that it is possible to maintain the function of a diode without breakdown up to a prescribed voltage in the reverse direction (for example, 600 V), and that application of a larger voltage than the prescribed voltage in the reverse direction results in breakdown and current flow. Thus, normal function as a diode was exhibited.

EXPLANATION OF SYMBOLS

2 Central angle
4 Chord
6 Minor arc
8 Arc-shaped section
10 Graphite crucible
12 Seed crystal holding shaft
14 Seed crystal
16 Removed section
18 Heat-insulating material
22 High-frequency coil
22A Upper level high-frequency coil
22B Lower level high-frequency coil
24 Si—C solution
26 Quartz tube
28 Meniscus
30 Meniscus angle of meniscus formed at chord
31 Meniscus angle of meniscus formed at arc-shaped section
32 Top face of seed crystal
34 Bottom face of seed crystal
36 Side face of seed crystal
100 Single crystal production apparatus

What is claimed is:

1. A method for producing a SiC single crystal by a solution process in which a SiC seed crystal held on a seed crystal holding shaft is contacted with a Si—C solution having a temperature gradient such that a temperature of the Si—C solution decreases from an interior of the Si—C solution toward a surface of the Si—C solution, wherein
   the seed crystal has a bottom face situated parallel to the surface of the Si—C solution, a top face held on the seed crystal holding shaft, and a side face between the top face and the bottom face,
   the bottom face of the seed crystal is a (0001) face or (000-1) face,
   a shape of the bottom face of the seed crystal is a circular shape with at least a partially removed section, and having a circular arc-shaped section on an outer periphery of the bottom face,
   the number of the removed sections is one or two,
   shapes of the removed sections are bow-shaped with a minor arc or semi-circumference removed along a chord connecting two points on the circular arc,
   a central angle formed by a center of the circular shape and the two points on the circular arc of each removed section is 90° or greater, and
   a total of the central angles of the removed sections is no greater than 180°,
   the method comprising forming a meniscus between the seed crystal and the Si—C solution and growing the SiC single crystal from the bottom face of the seed crystal.

2. A method according to claim 1, wherein the number of the removed sections is 1.

3. A method according to claim 1, comprising rotating the seed crystal in a direction parallel to the surface of the Si—C solution when the seed crystal is being contacted with the Si—C solution.

4. A method according to claim 2, comprising rotating the seed crystal in a direction parallel to the surface of the Si—C solution when the seed crystal is being contacted with the Si—C solution.

5. A method according to claim 1, wherein a central angle formed by a center of the circular shape and the two points on the circular arc of each removed section is 100° or greater.

* * * * *